(12) United States Patent
Kazemi

(10) Patent No.: US 10,447,277 B1
(45) Date of Patent: Oct. 15, 2019

(54) METHOD OF ELECTRICAL RECONFIGURABILITY AND AN ELECTRICAL RECONFIGURABLE LOGIC GATE DEVICE INSTRINSICALLY ENABLED BY SPIN-ORBIT MATERIALS

(71) Applicant: Mohammad Kazemi, Rochester, NY (US)

(72) Inventor: Mohammad Kazemi, Rochester, NY (US)

(73) Assignee: University of Rochester, Rochester, NY (US)

( * ) Notice: Subject to any disclaimer, the term of this patent is extended or adjusted under 35 U.S.C. 154(b) by 0 days.

(21) Appl. No.: 16/120,920

(22) Filed: Sep. 4, 2018

(51) Int. Cl.
*H03K 19/18* (2006.01)
*H03K 19/20* (2006.01)
*H01L 43/02* (2006.01)

(52) U.S. Cl.
CPC ............. *H03K 19/18* (2013.01); *H01L 43/02* (2013.01); *H03K 19/20* (2013.01)

(58) Field of Classification Search
CPC ......... H03K 19/18; H03K 19/20; H01L 43/02
USPC .......................................................... 326/93
See application file for complete search history.

(56) References Cited

U.S. PATENT DOCUMENTS

| | | | |
|---|---|---|---|
| 10,062,731 B2 * | 8/2018 | Manipatruni | H01L 27/22 |
| 2014/0056061 A1 * | 2/2014 | Khvalkovskiy | H01L 43/02 365/158 |
| 2018/0240964 A1 * | 8/2018 | Nikonov | H01L 43/08 |
| 2019/0057731 A1 * | 2/2019 | Lua | G11C 11/16 |

OTHER PUBLICATIONS

Wolf, S.A., et al., "Spintronics: A Spin-Based Electronics Vision for the Future," 2001, Science, vol. 294 (pp. 1488-1495).
Nikonov, D.E., et al., "Power dissipation in spintronic devices out of thermodynamic equilibrium," 2006, Journal of Superconductivity and Novel Magnetism, vol. 19 (31 pgs).
Markov, Igor L., "Limits on fundamental limits to computation," 2014, Nature, vol. 512 (pp. 147-154).
Miron, I., et al., "Perpendicular switching of a single ferromagnetic layer induced by in-plane current injection," 2011, Nature, vol. 476 (pp. 189-193).
Liu, L., et al., "Current-Induced Switching of Perpendicularly Magnetizd Magnetic Layers Using Spin Torque from the Spin Hall Effect," 2012, Physical Review Letters, vol. 109 (5 pgs).
Liu, L., et al., "Spin-Torque Switching with the Giant Spin Hall Effect of Tantalum," 2012, Science, vol. 336 (pp. 555-558).

(Continued)

*Primary Examiner* — Daniel D Chang
(74) *Attorney, Agent, or Firm* — Harris Beach PLLC

(57) ABSTRACT

An integrated logic device includes a channel having an interconnect section and a pair of spin-orbit segments connected to the interconnect section at either end of the interconnect section. A P structure includes a P magnet disposed on a surface of a spin-orbit segment. A tunneling barrier is disposed between the P magnet and a Rp magnetic reference layer. A Q structure includes a Q magnet disposed on a surface of the other spin-orbit segment. A tunneling barrier is disposed between the Q magnet and a Rq magnetic reference layer. A method of integrated logic spin-orbit perpendicular-anisotropy (SOPE) gate device operation is also described.

12 Claims, 14 Drawing Sheets

$R_p$ & $R_q$. Magnetic reference layer
P & Q. Magnetic free layer
S. Spin-orbit layer
B. Buffer layer
I. Interconnect

(56) References Cited

OTHER PUBLICATIONS

Garello, K., et al., "Symmetry and magnitude of spin-orbit torques in ferromagnetic heterostructures," 2013, Nature Nanotechnology, vol. 8 (pp. 587-593).
Kim, J., et al., "Layer thickness dependence of the current-induced effective field vector in Ta | CoFeB | MgO," 2013, Nature Materials, vol. 12 (pp. 240-245).
Pai, C. F., et al., "Enhancement of perpendicular magnetic anisotropy and transmission of spin-Hall-effect-induced spin currents by a Hf spacer layer in W/Hf/CoFeB/MgO layer structures," 2014, Applied Physics Letters, vol. 104 (6 pgs).
Zhang, W., et al., "Role of transparency of platinum-ferromagnet interface in determining intrinsic magnitude of spin Hall effect," 2015, Nature Physics, vol. 11 (20 pgs).
Mellnik, A.R., et al., "Spin-transfer torque generated by a topological insulator," 2014, Nature, vol. 511 (pp. 449-451).
Fan, Y., et al., "Magnetization switching through giant spin-orbit torque in a magnetically doped topological insulator heterostructure," 2014, Nature Materials, vol. 13 (pp. 699-704).
Mahendra, D.C., et al., "Room-temperature perpendicular magnetization switching through giant spin-orbit torque from sputtered $Bi_xSe_{(1-x)}$ topological insulator material," 2017, arXiv preprint arXiv: 1703.03822 (14 pgs.).
Kazemi, M., et al., "All-Spin-Orbit Switching of Perpendicular Magnetization," 2016, IEEE Transactions on Electron Devices, vol. 63, No. 11 (pp. 4499-4505).
Ney, A., et al., "Programmable computing with a single magnetoresistive element," 2003, Nature, vol. 425 (pp. 485-487).
Dery, H., et al., "Spin-based logic in semiconductors for reconfigurable large-scale circuits," 2007, Nature, vol. 447, (pp. 573-576).
Xu, P., et al., "An all-metalic logic gate based on current-driven domain wall motion," 2008, Nature Nanotechnology, vol. 3 (pp. 97-100).
Behin-Aein, B., et al., "Proposal for an all-spin logic device with built-in memory," 2010, Nature Nanotechnology, vol. 5 (pp. 266-270).
Su, L., et al., "Current-limiting challenges for all-spin logic devices," 2015, Scientific Reports, vol. 5 (pp. 1-11).
Mankalale, M.G., et al., "CoMET: Composite-Input magnetoelectric-based Logic Technology," 2017, IEEE Journal on Exploratory Solid-State Computational Devices and Circuits, vol. 3 (pp. 27-36).
Manipatruni, S., et al., "Spin-Orbit Logic with Magnetoelectric Switching: A Multi-Generation Scalable Charge Mediated Nonvolatile Spintronic Logic," 2017, arXiv preprint arXiv: 1512.05428 3 (60 pgs).
Kazemi, M., et al., "Compact Model for Spin-Orbit Magnetic Tunnel Junctions," 2016, IEEE Transactions on Electron Devices, vol. 63, No. 2 (pp. 848-855).
Kazemi, M., et al., "Adaptive Compact Magnetic Tunnel Junction Model," 2014, IEEE Transactions on Electron Devices, vol. 61, No. 11 (pp. 3883-3892).
Ikeda, S., et al., "Tunnel magnetoresistance of 604% at 300 K by suppression of Ta diffusion in CoFeB/MgO/CoFeB pseudo-spin-valves annealed at high temperature," 2008, Applied Physics Letters, vol. 93 (pp. 0825081-0825083).
Fluhr, E.J., et al., "POWER8: A 12-Core Server-Class Processor in 22 nm SOI with 7.6Tb/s Off-Chip Bandwidth," 2014, International Solid-State Circuits Conference, Session 5, Processors 5.1 (pp. 96-98).
Bowhill, B., et al., "The Xeon® Processor E5-2600 v3: a 22 nm 18-Core Product Family," 2016, IEEE Journal of Solid State Circuits, vol. 51, No. 1 (pp. 92-104).
Kazemi, M., et al., "gMRAM: Gain-Cell Magnetoresistive Random Access Memory for High Density Embedded Storage and in-Situ Computing," 2017, IEEE International Midwest Symposium on Circuits and Systems (pp. 405-408).
Esmaeilzadeh, H., et al., "Dark Silicon and the End of Multicore Scaling," 2012, IEEE Micro, vol. 32 (pp. 122-134).
Fayneh, E., et al., "14nm 6th-Generation Core Processor SoC with Low Power Consumption and Improved Performance," 2016, IEEE International Solid-State Circuits Conference, Session 4, Digital Processors, 4.1 (pp. 72-73).
Slonczewski, J.C., "Current-driven excitation of magnetic multilayers," 1996, Journal of Magnetism and Magnetic Materials, vol. 159 (pp. L1-L7).
Brown, W.F., Jr., "Thermal Fluctuations of a Single-Domain Particle," 1963, Journal of Applied Physics, vol. 130, No. 5 (pp. 1677-1686).

\* cited by examiner $R_P$ & $R_Q$: Magnetic reference layer
P & Q: Magnetic free layer
S: Spin-orbit layer
B: Buffer layer
I: Interconnect

| $q_1$ | $J(V_{CLK_{Q1}}, q_1)$ | $p_2$ | $p_2'$ |
|---|---|---|---|
| 0 | J- | 0 | 0 |
| 0 | J- | 1 | 0 |
| 1 | J+ | 0 | 1 |
| 1 | J+ | 1 | 1 |

METHOD OF ELECTRICAL RECONFIGURABILITY AND AN ELECTRICAL RECONFIGURABLE LOGIC GATE DEVICE INSTRINSICALLY ENABLED BY SPIN-ORBIT MATERIALS

FIELD OF THE APPLICATION

The application relates to logic gates and particularly to reconfigurable logic gates.

BACKGROUND

In the background, other than the bolded paragraph numbers, non-bolded square brackets ("[ ]") refer to the citations listed hereinbelow.

Spin degree of freedom has emerged as a primary candidate for the implementation of computing technologies that are nonvolatile and scalable to ultralow energy dissipation [1-3].

SUMMARY

According to one aspect, an integrated logic device includes a channel having an interconnect section and a pair of spin orbit segments. Each spin orbit segment is connected to the interconnect section at either end of the interconnect section. A P structure includes a P magnet disposed on a surface of a spin orbit segment. A tunneling barrier is disposed between the P magnet and a Rp magnetic reference layer. A Q structure includes a Q magnet disposed on a surface of the other spin orbit segment. A tunneling barrier is disposed between the Q magnet and a Rq magnetic reference layer. A CLKp terminal is electrically coupled to the Rp magnetic reference layer. A CLKq terminal is electrically coupled to the Rq magnetic reference layer. At least one ground terminal is electrically coupled to a surface of either of the interconnect section or the pair of spin orbit segments.

In one embodiment, at least one of the P magnet or the Q magnet includes a perpendicular-anisotropy nanomagnet.

In another embodiment, at least one of the P magnet or the Q magnet includes an elliptical shape.

In yet another embodiment, a long axis of an elliptical magnet encloses an angle of Θ between about 5 and 175 degrees with current flow in the interconnect section.

In yet another embodiment, the integrated logic device further includes an optional buffer layer disposed between the P magnet and the Q magnet and the surface of a spin orbit segment.

In yet another embodiment, the integrated logic device further includes a cascaded integrated logic device coupled to a side of a spin orbit segment of the pair of spin orbit segments.

In yet another embodiment, the interconnect section includes a metal.

In yet another embodiment, the interconnect section includes copper.

In yet another embodiment, at least one of the spin orbit segments includes a heavy metal.

In yet another embodiment, at least one of the spin orbit segments includes platinum.

In yet another embodiment, the integrated logic device is a spin-orbit perpendicular-anisotropy (SOPE) gate.

In yet another embodiment, the integrated logic device substantially simultaneously performs a logic operation and stores a non-volatile result of the logic operation.

According to another aspect, a method of integrated logic device operation includes: providing an integrated spin-orbit perpendicular-anisotropy (SOPE) gate device having a CLKp terminal and a CLKq terminal, the SOPE gate device configurable to a NAND gate or a NOR gate; and applying a clock pulse to the CLKp terminal to perform a logic operation, or applying a clock pulse to the CLKq terminal to configure the integrated logic device as the NAND gate or as the NOR gate.

In one embodiment, the step of applying a clock pulse includes generating a channel current density determined by an amplitude of the clock pulse and a logic operand stored in a magnet.

In another embodiment, the step of applying a clock pulse includes applying a clock pulse to the CLKp terminal to perform a logic operation where nanomagnet Q either retains an initial state or switches another state, depending on a density of a channel current produced by applying the clock pulse to the CLKp terminal.

In yet another embodiment, the step of applying a clock pulse includes modulating a magnetic energy landscape with respect to a spin accumulation direction to cause a symmetry of an energy barrier between two stable magnetization states to be broken.

In yet another embodiment, the step of applying a clock pulse includes operating the integrated logic device based on a bounded switching of the Q magnet through spin-orbit torques produced by a current pulse injected into the channel caused by applying a voltage pulse to the CLKp terminal.

In yet another embodiment, the step of applying a clock pulse includes applying a clock pulse for performing a logic operation or a clock pulse for transferring a gate output state to an input of another gate causes current induced spin-orbit torques to move a magnetization from a stable state toward an x-y plane.

In yet another embodiment, after the clock pulse is turned off, the magnetization may either turn back to an initial stable state or switch to another stable state, depending on a duration and an amplitude of the clock pulse.

In yet another embodiment, the method further includes, after said applying step, a step of storing a non-volatile result of a logic operation.

The foregoing and other aspects, features, and advantages of the application will become more apparent from the following description and from the claims.

BRIEF DESCRIPTION OF THE DRAWINGS

The features of the application can be better understood with reference to the drawings described below, and the claims. The drawings are not necessarily to scale, emphasis instead generally being placed upon illustrating the principles described herein. In the drawings, like numerals are used to indicate like parts throughout the various views.

DETAILED DESCRIPTION

Figure 1A:
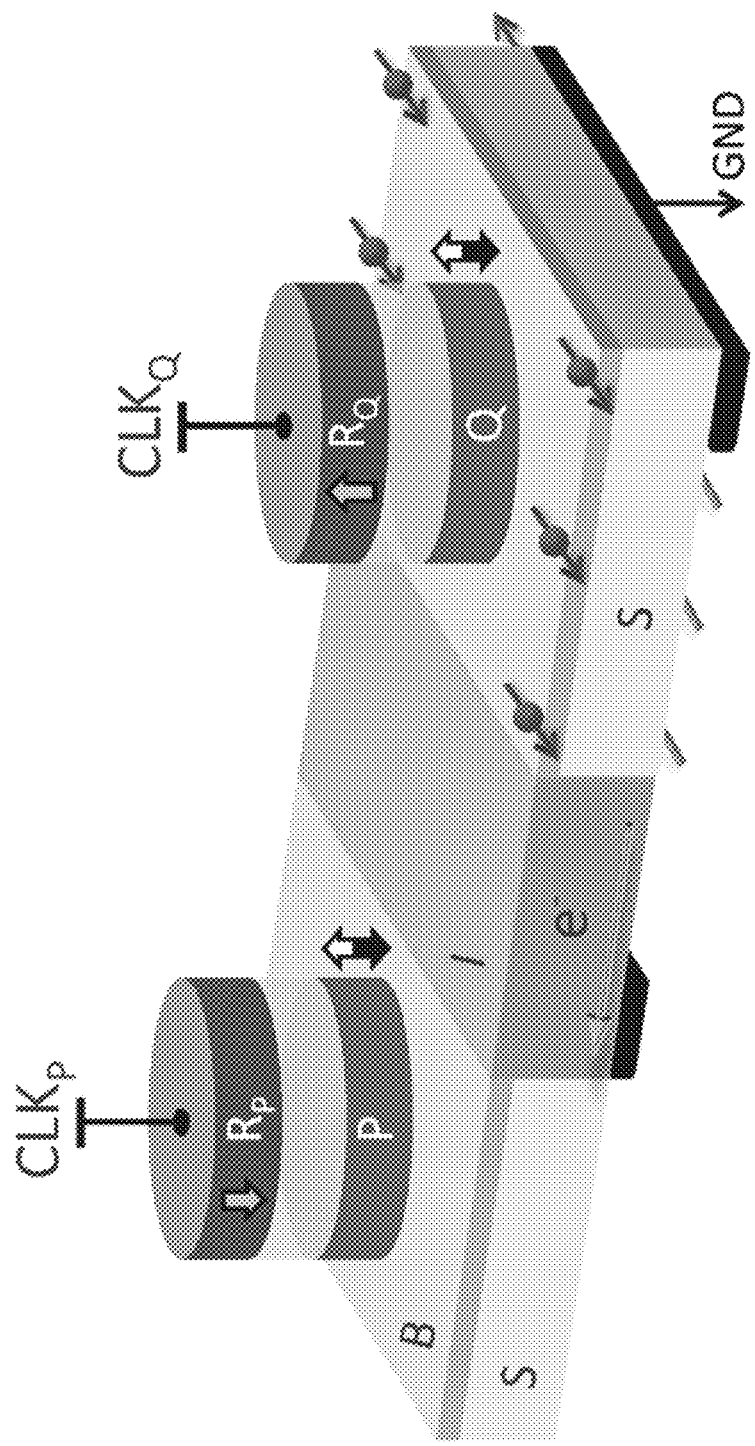
FIG. 1A shows a drawing illustrating an exemplary spin-orbit perpendicular-anisotropy (SOPE) logic gate.

In the description, other than the bolded paragraph numbers, non-bolded square brackets ("[ ]") refer to the citations listed hereinbelow.

Spin degree of freedom has emerged as a primary candidate for the implementation of computing technologies that are nonvolatile and scalable to ultralow energy dissipation [1-3]. Materials with strong spin-orbit coupling, referred to as the spin-orbit materials, have been widely considered for efficient producing of spin current [4-14]. In-plane current injection into a spin-orbit layer gives rise to spin currents which produce torques, namely a damping-like spin-orbit torque and a field-like spin-orbit torque, on the magnetization of an adjacent ferromagnetic layer. Spin-orbit heterostructures have received significant attention, because for every electron charge injected into the spin-orbit layer, many h/2 units of angular momentum may flow into the ferromagnet and produce spin-orbit torques on the magnetization, thereby providing an energy efficient mechanism for magnetization manipulation. Spin-orbit heterostructures with perpendicular magnetic anisotropy are the mainstay of spin-orbitronics owing to high thermal stability and scalability. Current induced spin-orbit torques which can inherently execute stateful logic operations in perpendicular-anisotropy heterostructures are described in this Application in detail hereinbelow.

As in previous proposals for spin-based logic [15-19], we represent data using a bistable magnetization state. However, in contrast to proposal in ref. [15] which uses current induced magnetic fields or the proposal in ref. [16] which requires additional circuits to convert spin signals into magnetic fields for switching a nanomagnet, the methods and devices of the Application use spin currents to directly switch nanomagnets via spin-orbit torques. The methods and devices of the Application rely on an intrinsic property in spin-obit heterostructures to make possible a logic gate in which the same magnetic contacts that retain the logic inputs serve to simultaneously perform a logic operation and retain the result of the logic operation. This new approach is in contrast to the structures proposed in refs. [18, 19] which require ancillary magnetic contacts and additional circuits to perform a logic operation by adopting the majority rule and employing non-local spin signals. Also, this new approach is in contrast to refs [20, 21] that require ancillary charge-based elements, magnetoelectric materials, in-plane and perpendicular anisotropy ferromagnetic materials, and various interfaces to perform a logic operation by relying on magnetoelectric switching mechanism and by adopting the majority rule. Furthermore, the proposals in refs. [20, 21] use the charge degree of freedom in performing a logic operation, and similar to the proposal in ref. [16], they ([20,21]) require frequent spin to charge conversion which includes advantages of spin-based computing. Previous proposals for reconfigurable spin-based computing require a reconfigurable magnetic setup embedded in each individual logic gate to configure the gate at run time. This requires switching of one or more magnetic contacts in a gate, and the use of extra hardware elements in the gates which counters the advantages of reconfigurability. The proposed new methods and spin-orbitronics gate devices of this Application can be electrically reconfigured at run time by choosing the amplitude of the clock pulse.

Figure 1B:
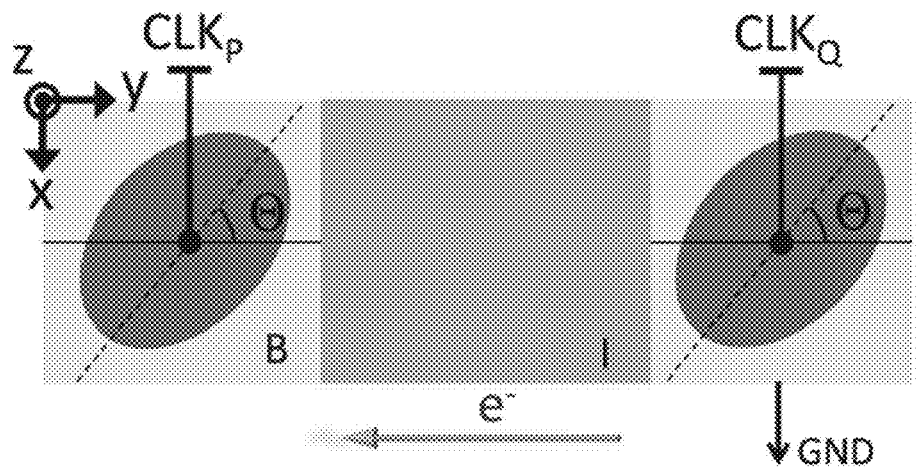
FIG. 1B shows a drawing of the x-y plane of the logic gate of FIG. 1A.

FIG. 1A-FIG. 1E show an exemplary spin-orbit perpendicular-anisotropy (SOPE) logic gate. FIG. 1A shows a perspective drawing of a logic gate where logic operands are stored over the bistable magnetization state of nanomagnets P and Q which communicate through a channel. The channel comprises two segments with strong spin-orbit interaction (S) which are connected via an interconnect (I). The interconnect material can comprise a low resistivity metal such as copper, and the spin-orbit segments can be made of a heavy metal [4-10] or a topological insulator [11-13]. The gate operates based on the 'bounded switching' of Q through the spin-orbit torques produced by a current pulse injected into the channel by applying a voltage pulse to $CLK_p$. Information stored in P is used to control the current density through the magnetoresistance effect for a given amplitude of the voltage pulse applied to $CLK_p$. FIG. 1B shows a drawing of the x-y plane of the logic gate of FIG. 1A. Magnets P and Q are elliptical, with the length of the ellipse enclosing an angle of θ with the current flow (y axis).

Summarizing the embodiment of FIG. 1A, FIG. 1B, the channel includes three sections: two sections composed of a material with strong spin-orbit interaction (such as, for example, platinum) and connected using an interconnect (such as, for example, copper). The illustrated buffer layer is optional. Only the two lower layers, marked as P and Q, should be elliptical. The middle tunneling barrier layer and the layers marked as R_P and R_Q can have any suitable shape. Layers P and Q are nanomagnets. They behave as "magnetic free layers" in contrast to the R_P and R_Q which play the role of "magnetic reference layers". The middle layer is a "tunneling barrier". The tunneling barrier can be a thin oxide layer, such as, for example, MgO, placed between the two ferromagnetic layers. The white and black arrows represent the PMA. The arrows shown near the Q nanomagnet and the arrows below the S layer under Q represent the spin-polarized electrons. The arrow on the side of the interconnect shows the direction of electron flow (opposite to the channel current).

Figure 1C:
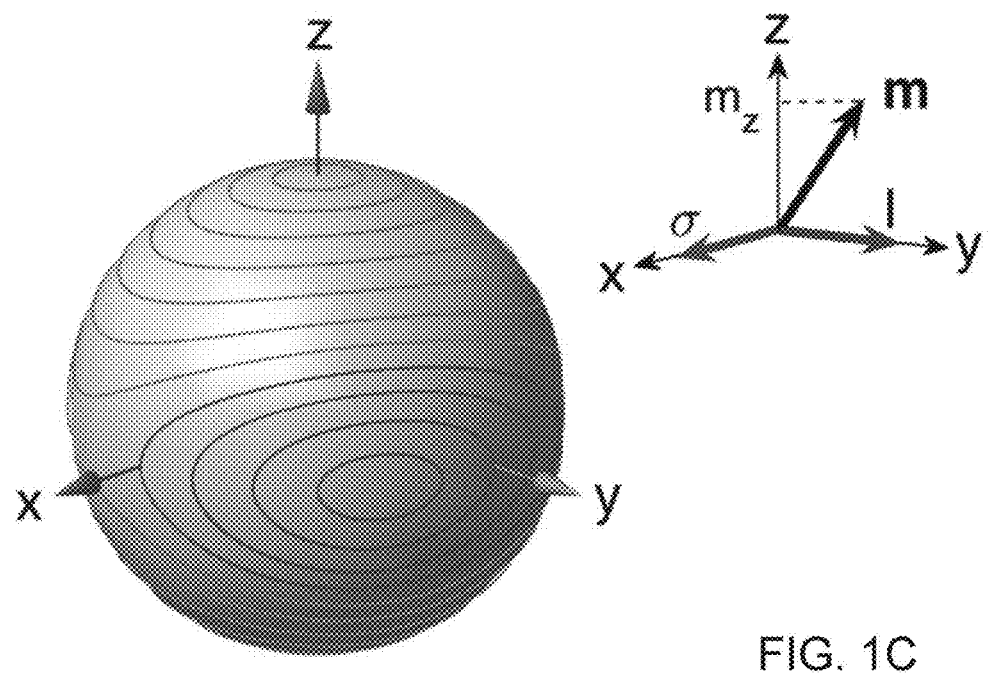
FIG. 1C shows a magnetic energy landscape of P and Q.

FIG. 1C shows a magnetic energy landscape of P and Q which is asymmetric with respect to the spin accumulation direction a (x axis), leading to the bounded switching.

Figure 1D:
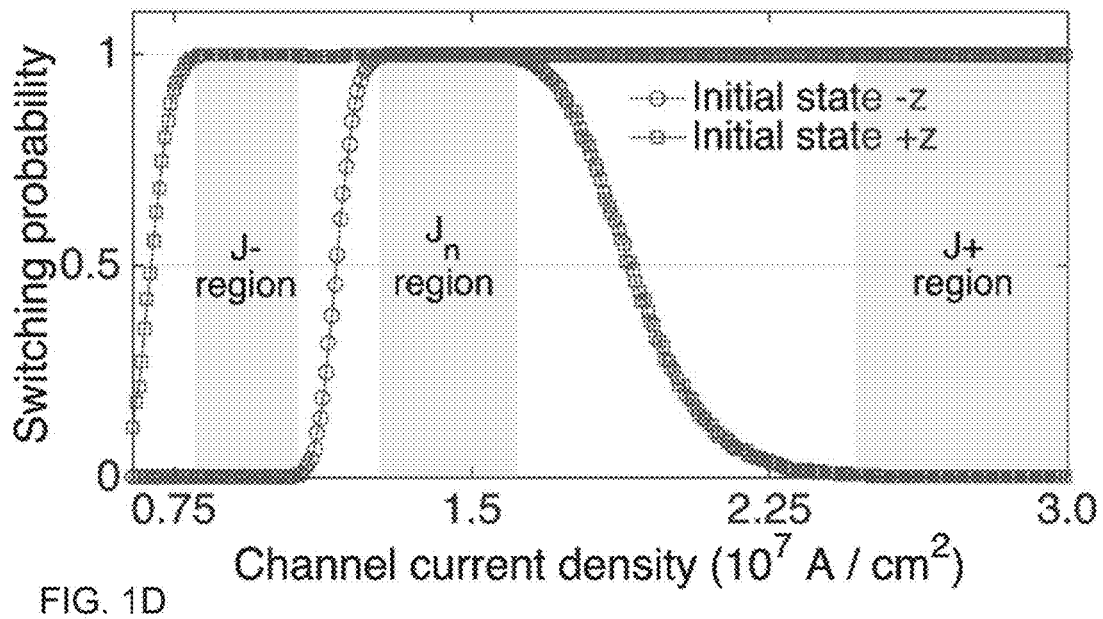
FIG. 1D shows a graph of switching probability versus channel current density.
Figure 1E:
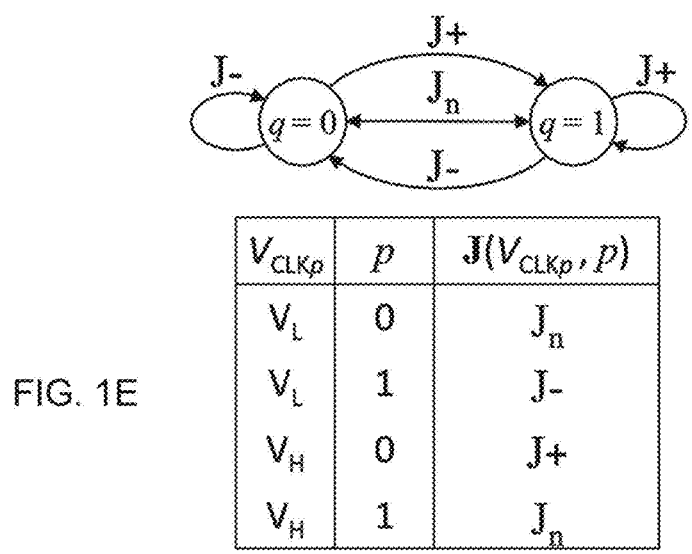
FIG. 1E shows a Markov chain representing the bounded switching of Q.
Figures 2A, 2B, 2C:
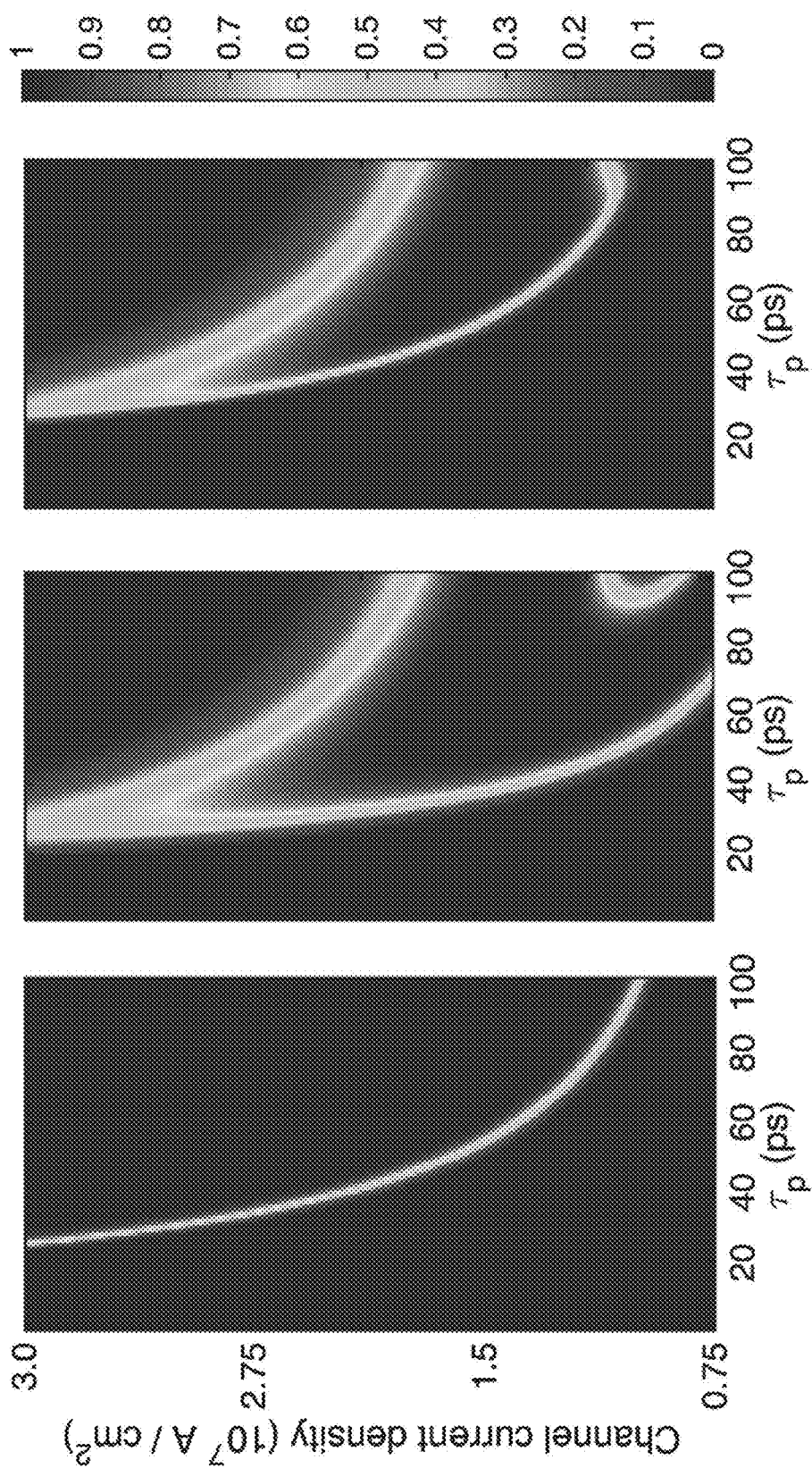
FIG. 2A shows a switching probability diagram corresponding to the initial magnetization state −z.
FIG. 2B shows a switching probability diagram corresponding to the initial magnetization state +z.
FIG. 2C shows a probability diagram for switching events independent of the initial magnetization state (multiplication of the diagrams shown in FIG. 2A and FIG. 2B)

FIG. 1D shows a graph of switching probability versus channel current density as bounded switching probability diagrams of P or Q for θ=60° at room temperature as a function of the channel current density produced by a clock pulse with a duration of 75 ps applied to the $CLK_p$ (See also FIG. 2A-FIG. 2C). Experimentally verified parameters [13] of $Bi_xSe_{(1-x)}$(4 nm)/Ta (0.5 nm) were used for the channel, where the numbers in parenthesis are the layers thicknesses. Accordingly, the spin Hall angle was set to ζ=18.83. Perpendicular magnetic anisotropy (PMA) field was set to 1000 Oe, damping coefficient was set to 0.2, and the saturation magnetization was set to 2000 emu/cm³. The width and length of P and Q are, respectively, 32 nm and 96 nm and the channel width was 85 nm. Calculations were repeated 10,000 times for each point. FIG. 1E shows a Markov chain representing the bounded switching of Q. Nanomagnet Q retains the current state or switch to the other stable state depending on the channel current density J which is controlled by the magnetization state of P and the amplitude of the clock pulse applied to $CLK_p$, i.e., $J=J(V_{CLKp},p)$.

Structure and Operation of the Spin-Orbit Perpendicular-Anisotropy Gate

The basic spin-orbit perpendicular-anisotropy (SOPE) gate is illustrated as described hereinabove in FIG. 1A-FIG. 1E. Perpendicular-anisotropy nanomagnets, denoted by P and Q, retain logic operands p and q over the bistable magnetization states. Magnetization orientation along +z(−z), illustrated in FIG. 1A by a white (black) arrow, represents binary 1 (0). As illustrated in FIG. 1B, nanomagnets P and Q have an elliptical cross section, where the long axis of the ellipse encloses an angle of θ with the current flow (y axis). Hence, the magnetic energy landscape of the nanomagnets, illustrated in FIG. 1C, is asymmetric with respect to the spin accumulation direction a (x axis).

The new concept underlying the operation of the gate of this Application is an intrinsic property referred to as the 'bounded switching'. Due to the asymmetry of the magnetic energy landscape with respect to the spin accumulation direction, as illustrated in FIG. 1C, a channel current with a duration $T_p$ and a density $J_n$ reverses the magnetization independent of the initial state (+z or −z), while a channel current with the same duration and a larger density J+ (smaller density J−) reverses the magnetization only if the initial state is −z(+z) (See also: FIG. 1A-FIG. 2C). Hence, as illustrated in FIG. 1D, the switching probability diagram in response to current-induced spin-orbit torques comprises three primary regions denoted as J−$J_n$, and J+ region. Accordingly, as the Markov chain in FIG. 1E illustrates, nanomagnet Q may retain the initial state or switch the other state, depending on the density of the channel current produced by applying a clock pulse to $CLK_p$. The Markov chain comprises two states representing the stable states of Q, i.e., q=0 and q=1. The a $\xrightarrow{b}$ c over the Markov chain is read as 'the state of Q changes from a to c if the channel current density lies within the region b'. For a given amplitude of the clock pulse ($V_{CLKp}$), operand p controls the channel current density (J) via the magnetoresistance effect.

FIG. 2A-FIG. 2C shows bounded switching probability diagrams at room temperature, corresponding to the nanomagnet P or Q for Θ=60°, as a function of the channel current density and duration ($\tau_p$). Device parameters are as explained in FIG. 1A-FIG. 1E. FIG. 2A shows a switching probability diagram corresponding to the initial magnetization state −z. FIG. 2B shows a switching probability diagram corresponding to the initial magnetization state +z. FIG. 2C shows a probability diagram for switching events independent of the initial magnetization state (multiplication of the diagrams shown in FIG. 2A and FIG. 2B). The calculations were repeated 10,000 times for each pixel.

To assess the bounded switching operation at room temperature, simulations were performed using an experimentally benchmarked model for perpendicular-anisotropy spin-orbit heterostructures [22, 23] (See also: Supplementary Section 1). As illustrated in FIG. 2A-FIG. 2B, bounded switching is deterministically achievable in the presence of thermal noise and Joule heating for a wide range of the density and duration of the channel current. This eliminates the need for complex circuits to precisely control the duration and amplitude of the clock pulse. Hence, as in proposals for all-spin logic devices [18], a clock pulse may be delivered to a SOPE gate through a conventional clock distribution network providing zero (ground) and nonzero voltages up to a few hundreds of millivolts and zero (high impedance) and nonzero currents up to a few hundreds of microamperes.

The bounded switching mechanism can be explained in terms of spin current interaction with the magnetic energy landscape. By modulating the magnetic energy landscape with respect to the spin accumulation direction, as illustrated in FIG. 1C, the symmetry of the energy barrier between the two stable magnetization states is broken. Hence, depending on the initial magnetization state, different energy levels are used to switch the magnetization. These levels overlap, thereby creating an energy zone that switches the magnetization independent of the initial state. To our knowledge, bounded switching has not been observed in other spin-based or charge-based mechanism of magnetization manipulation.

The density of the channel current produced by applying a clock pulse to $CLK_p$ is determined by the amplitude of the clock pulse and the logic operand p stored in nanomagnet P, i.e., $J=J(V_{CLKp},p)$, where J denotes the channel current density and $V_{CLKp}$ denotes the amplitude of the clock pulse. For a given amplitude of the clock pulse, the logic operand stored in nanomagnet P controls the density of the channel current through the tunneling magnetoresistance effect (See also: Supplementary Section 2), i.e., $J(V_{CLKp},p=0)=J_0^P$ and $J(V_{CLKp}, p=1)=J_1^P$. Because the magnetization orientation of the reference layer $R_p$ is along the −z, an operand p=0 (p=1) leads to a parallel (antiparallel) configuration of the magnetic tunnel junction which comprises P and $R_p$ ($MTJ_p$). Thus, $J_0^P$ is larger than $J_1^P$. We use the standard notation '∈' to represent the region in which the channel current density lie, e.g., $J(V_{CLKp}, p)\in J_n$ is read as '$J(V_{CLKp},p)$ lies within the $J_n$ region'.

Figure 3A:
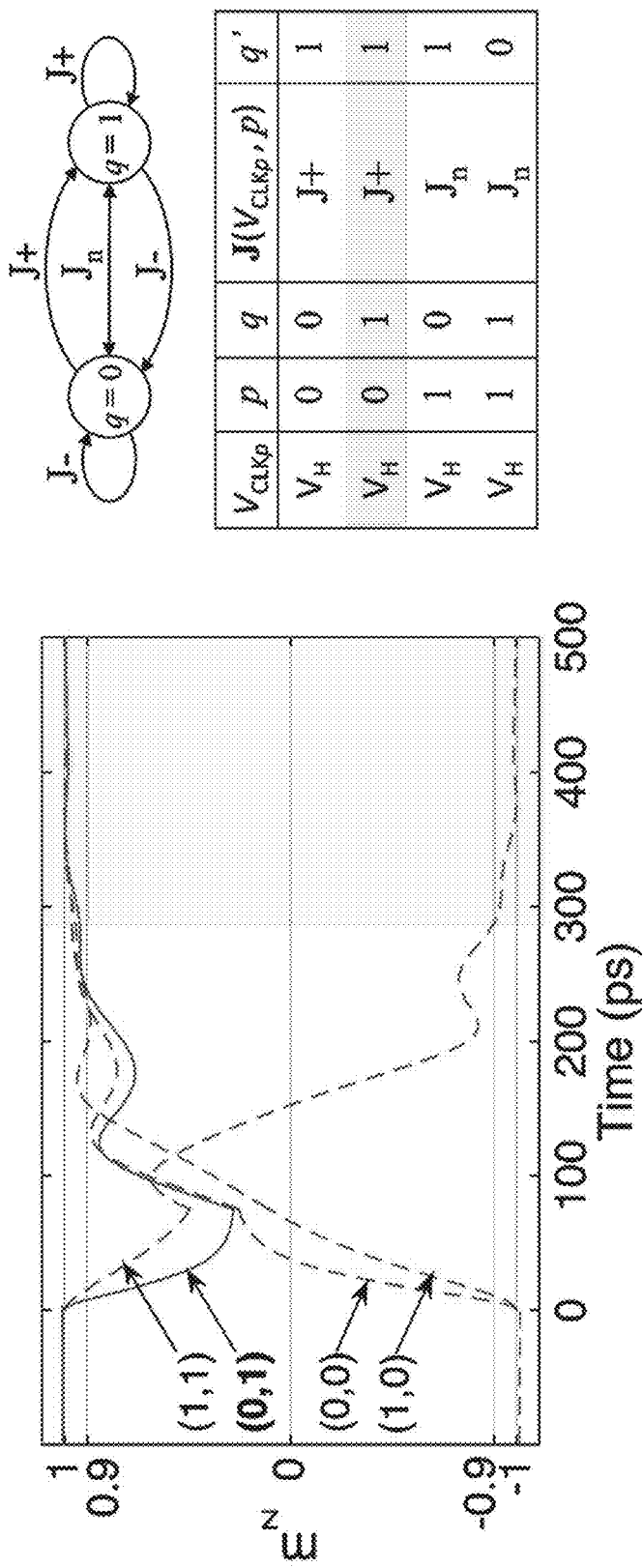
FIG. 3A shows a graph and a logic diagram and table of modeled for NAND operation.
Figure 3B:
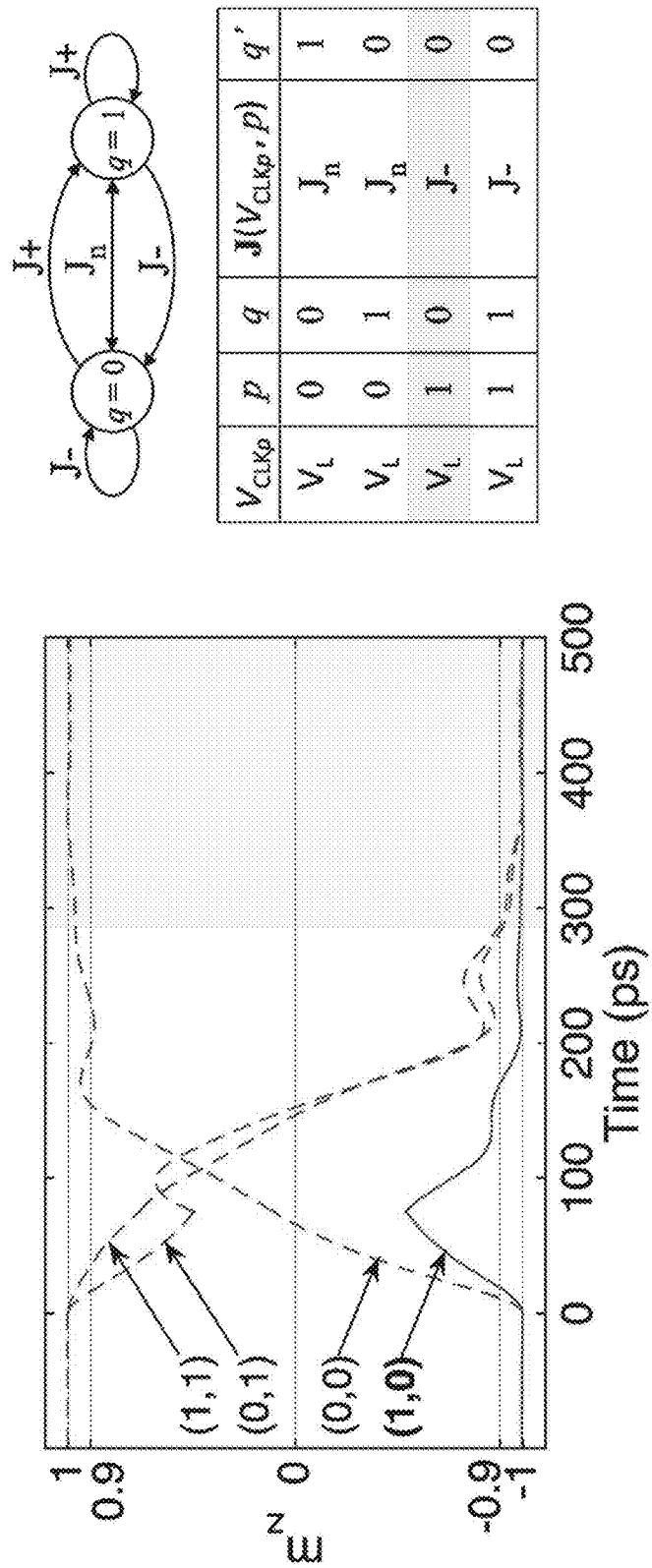
FIG. 3B shows a graph and a logic diagram and table of modeled for NOR operation.

FIG. 3A and FIG. 3B shows modeled behavior of the SOPE gate for NAND and NOR operations. Time evolution of the magnetization of Q along the z axis is denoted by $m_z$. FIG. 3A shows a graph and a logic diagram and table of modeled for NAND operation. The amplitude of the clock pulse is set to $V_H$ such that $J(V_H, p=0)\in J+$ and $J(V_H, p=1)\in J_n$. Thus, the magnetization of Q is preserved against switching only when (p,q)=(0,1), realizing the NAND operation in response to the clock pulse. FIG. 3B shows a graph and a logic diagram and table of modeled for NOR operation. The amplitude of the clock pulse is set to $V_L(<V_H)$ such that $J(V_L,p=0)\in J_n$ and $J(V_L,p=1)\in J-$. Hence, the magnetization of Q retains the initial state only when (p,q)=(1,0), realizing the NOR operation in response to the clock pulse.

Once a clock pulse is applied, a current flows into the channel and evolves the magnetization state of Q to the result of the logic operation targeted by choosing the clock amplitude. Here the execution of the NAND and NOR operations are explained, which are known to be universal, that is, every other function can be implemented using a network of NAND or NOR gates. By setting the amplitude of the clock pulse to $V_H$ such that $J_0^P \in J+$ and $J_1^P \in J_n$, the magnetization orientation of Q is preserved against reversal only when its initial orientation is $+z(q=1)$ and the channel current density lies within the J+ region (p=0), as illustrated in FIG. 3A. Consequently, magnetization of Q evolves to q'=pNANDq. Alternatively, by setting the amplitude of the clock pulse to a sufficiently smaller value $17_1$, such that $J_0 \in J_n$ and $J_1 \in J-$, the magnetization orientation of Q is preserved only when its initial orientation is $-z(q=0)$ and the amplitude of the channel current lies within the J- region (p=1), as illustrated in FIG. 3B. In this case, the magnetization of Q evolves to q'=pNORq.

Cascadability of the Spin-Orbit Perpendicular-Anisotropy Gates

Figure 4A:
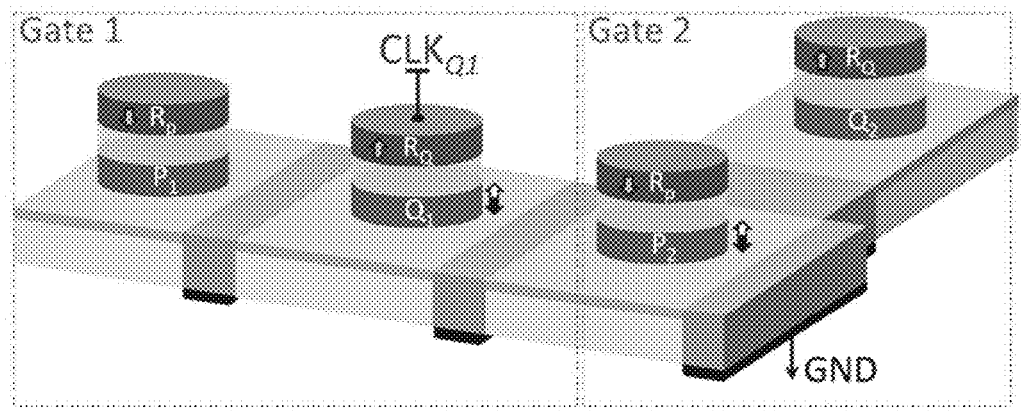
FIG. 4A shows a structure illustrating two cascaded gates.
Figure 4B:
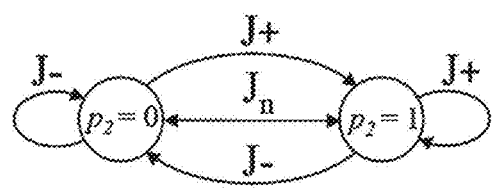
FIG. 4B shows a Markov chain representing state transfer from the output of gate 1 to an input of gate 2.
Figure 4C:
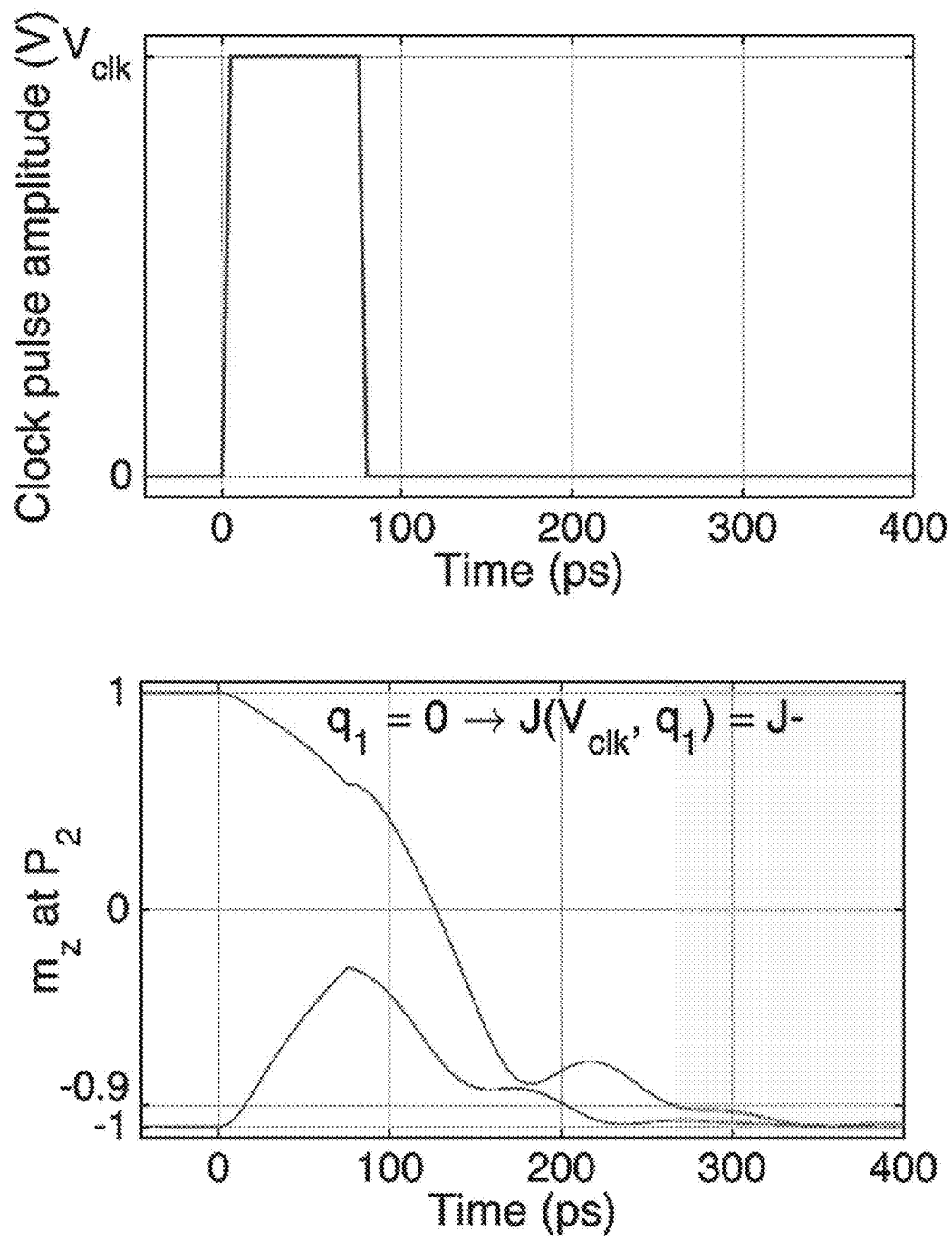
FIG. 4C shows magnetization switching trajectories corresponding to $P_2$ illustrating the transfer of $q_1=0$ to $P_2$.
Figure 4D:
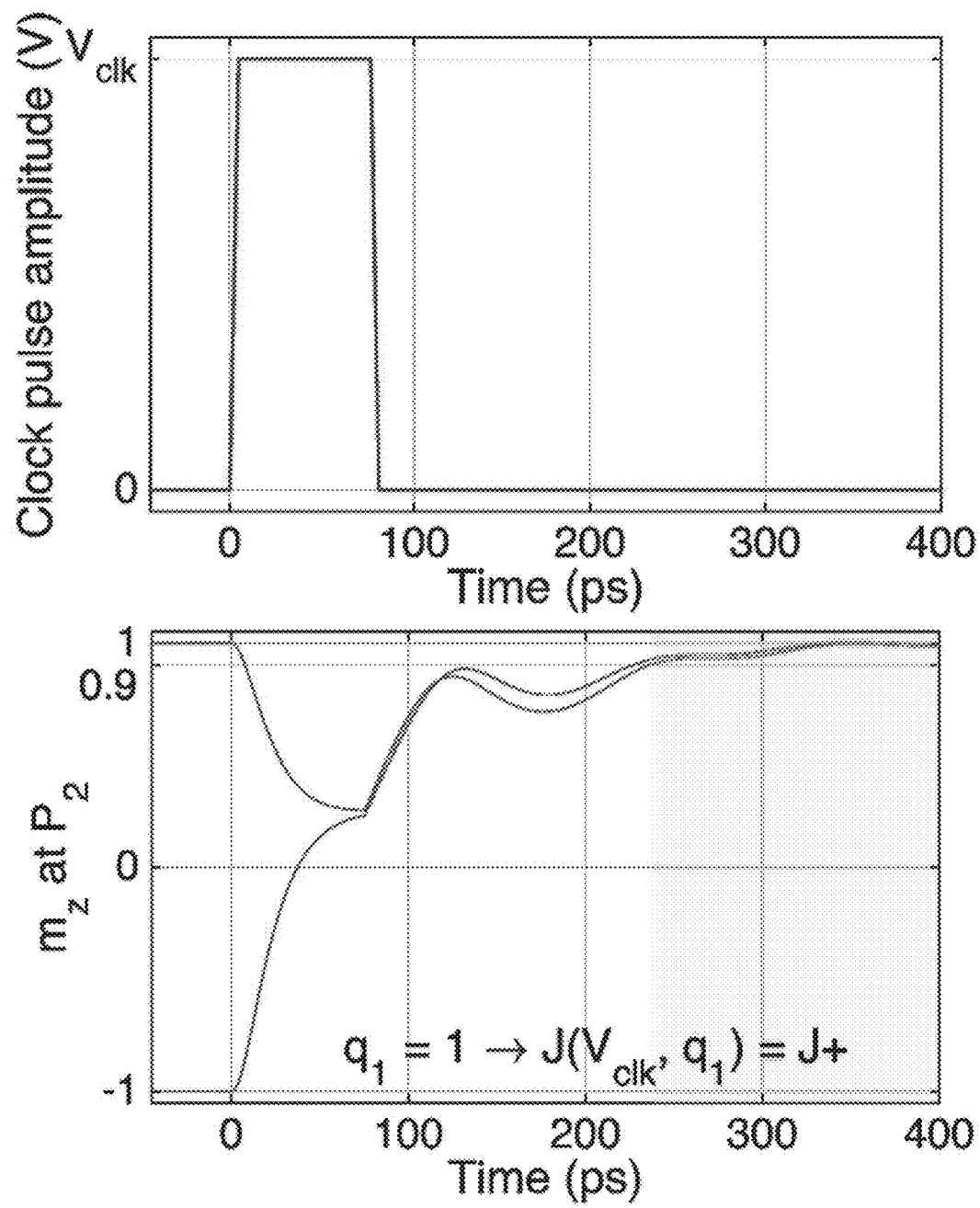
FIG. 4D shows magnetization switching trajectories corresponding to $P_2$, illustrating the transfer of $q_1=1$ to $P_2$.

FIG. 4A-FIG. 4D illustrate cascading SOPE gates. Inputs and output states of a SOPE gate are represented using stable states of a bistable magnetization, providing the opportunity to directly cascade the gates. FIG. 4A shows a structure illustrating two cascaded gates. FIG. 4B shows a Markov chain representing state transfer from the output of gate 1 to an input of gate 2. By setting the amplitude of the clock pulse applied to $CLK_{Q_1}$ such that $J(V_{clk}, q_1=0)$ (density of the channel current underneath $P_2$ when $q_1=0$) lies within the J- region, $J(V_{clk}, q_1=0)$ lies within the J+ region if $TMR_{Q_1}$ satisfies the constraint in equation (2). Hence, by applying the clock pulse to CLK $Q_1$, the output state of gate 1 ($q_1$) is transferred to the input of gate 2 ($P_2$). FIG. 4C shows magnetization switching trajectories corresponding to $P_2$, illustrating the transfer of $q_1=0$ to $P_2$. FIG. 4D shows magnetization switching trajectories corresponding to $P_2$, illustrating the transfer of $q_1=1$ to $P_2$. These exemplary switching probability diagrams are for the gates illustrated in FIG. 1D for $\tau_p=75$ ps and in FIG. 2A-FIG. 2C for a wide range of $\tau_p$.

The inputs and output states in a SOPE gate are represented using the stable magnetization states, providing the opportunity to directly cascade the gates without the need for any interface. FIG. 4A-FIG. 4D illustrate two cascaded gates denoted as the gate 1 and gate 2. Each gate is a two inputs, one output gate. The output state of the gate 1 (magnetization state of $Q_1$) can be copied to an input of gate 2 (nanomagnet $P_2$) via current induced spin-orbit torques produced by applying a clock pulse to the MTJ comprising $Q_1$ and $R_Q$ (MTJ $Q_1$). Because the magnetization orientation of the reference layer $R_Q$ is along the +z, an operand $q_1=0$ ($q_1=1$) leads to an antiparallel (parallel) configuration of $MTJ_{Q_1}$. Thus, $$J(V_{CLK_{Q_1}}, q_1=0) = J_0^q$$

is smaller than $$J(V_{CLK_{Q_1}}, q_1=1) = J_1^q.$$

The density of the channel current produced by applying a clock pulse to CLK $Q_1$ should satisfy $$J(V_{CLK_{Q_1}}, q_1=0) = J_0^q \in J- \quad (A1)$$
$$J(V_{CLK_{Q_1}}, q_1=1) = J_1^q \in J+, \quad (A2)$$

so that, by applying the clock pulse, the state of $P_2$ is switched to $p_2=1$ ($p_2'=0$) only if the state of $Q_1$ is $q_1=1$ ($q_1=0$), thereby performing the copy operation as illustrated in FIG. 4B. By setting $$V_{CLK_{Q_1}}$$

to $V_{clk}$ such that $J_0^q \in J-$, the $J_1^q \in J+$ is ensured if $TMR_{Q_1}$ satisfy $$TMR_{Q_1} \geq \frac{R_{eff} + R_1}{R_1} \frac{J(V_{clk}, q_1=1) - J(V_{clk}, q_1=0)}{J(V_{clk}, q_1=0)}, \quad (A3)$$

where $R_1$ denotes the resistance of $MTJ_{Q_1}$ when $q_1=1$ and $R_{eff}$ denotes the effective channel resistance (See also: Supplementary Section 3).

The resistance and TMR of an MTJ can be tuned over wide ranges. Experiments have demonstrated TMR values larger than six (600%) [24]. By designing the resistance of $MTJ_{Q_1}$ with respect to $R_{eff}$, a conventional value of $TMR_{Q_1}$ satisfies equation (A3). For the gates with switching probability diagram illustrated in FIG. 1D, by setting $$V_{CLK_{Q_1}}$$

such that $J_0^q=10^7$ A/cm$^2$($\in J-$) and by designing $R_1=R_{eff}$, a TMR=3 (300%) leads to $J_1^q=2.5\times 10^7$ A/cm$^2$ that lies within the J+ region. FIG. 4C and FIG. 4D illustrate the corresponding magnetization trajectory of $P_2$ along the z axis in response to application of the clock pulse to $CLK_{Q_1}$.

The cascadability of the SOPE gates is significantly robust against process variations. According to equation (A1), $J_0^q$ and $J_1^q$ may variate over the entire range of J- and J+ region, respectively. Hence, $$V_{CLK_{Q_1}}$$

and $TMR_{Q_1}$ may change over a wide range while satisfying constraint (A1) and (A3). Hence, as in proposals for all-spin logic devices [18], a clock pulse may be delivered through a conventional clock distribution network providing zero (ground) and nonzero voltages up to a few hundreds of millivolts and zero (high impedance) and nonzero currents up to a few hundreds of microamperes.

Dynamics of Time Evolution and Switching Speed

The switching time of nanomagnets in a SOPE gate is governed by the dynamics of the magnetization evolution in response to current induced spin-orbit torques. By applying a clock pulse for performing a logic operation or transferring the gate output state to the input of another gate, current induced spin-orbit torques move the magnetization from the stable state toward the x-y plane. Once the pulse is turned off, the magnetization may either turn back to the initial stable state or switch to the other stable state, depending on the duration and amplitude of the clock pulse, as illustrated in FIG. 2A-FIG. 2C. In both cases, the magnetization is stabilized through the interaction with the magnetic energy landscape of the nanomagnet. The duration of the stabilization process significantly depends on the strength of the demagnetization and PMA fields governing the magnetic energy landscape. By increasing the PMA field or decreasing the lateral dimensions of the nanomagnets, which in turn strengthen the in-plane demagnetization fields, the magnetization significantly faster evolves, resulting in a faster switching time.

Figure 5A:
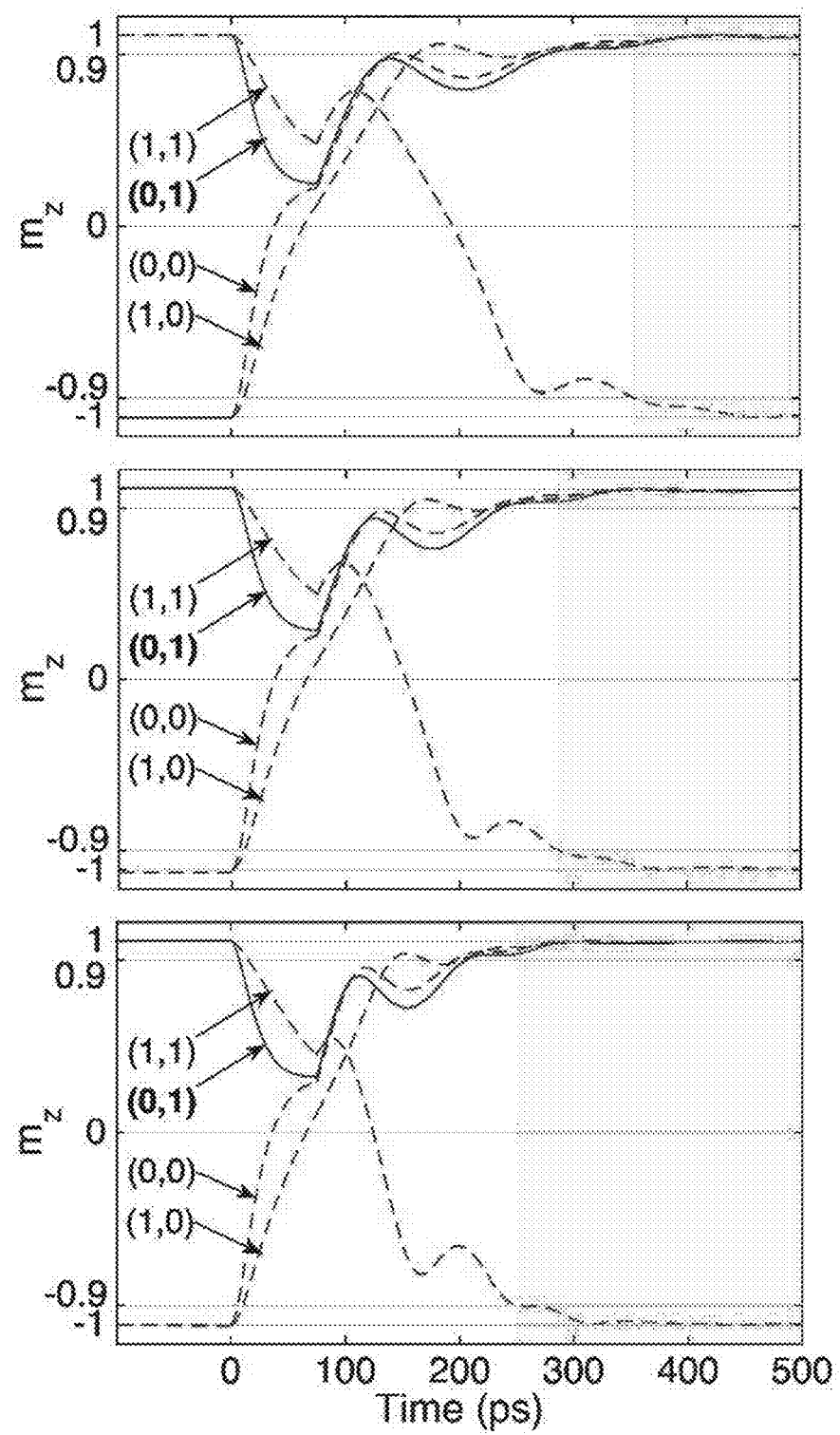
FIG. 5A shows magnetization switching trajectories of NAND operation performed by the gate composed of nanomagnets.
Figure 5B:
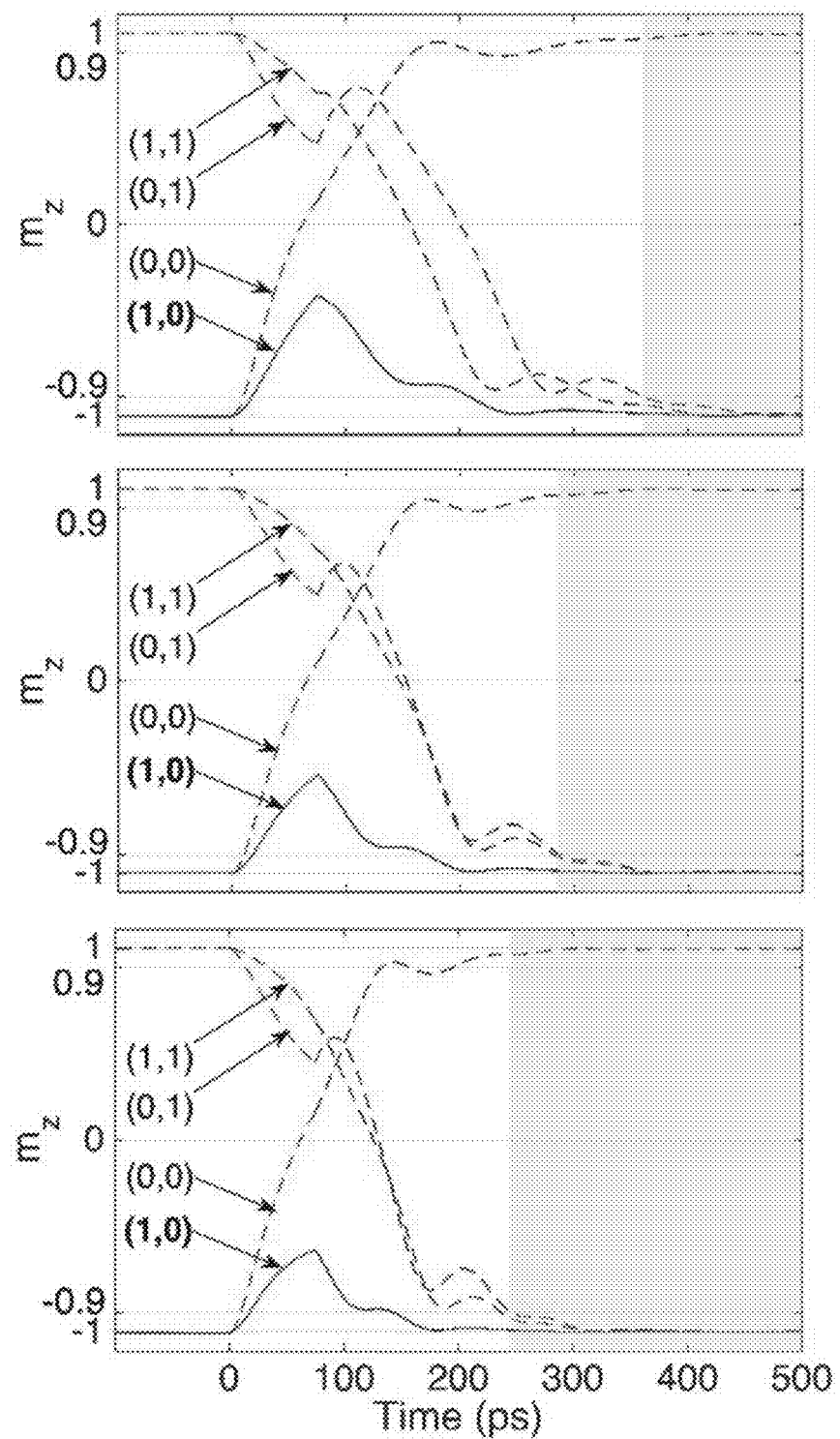
FIG. 5B show magnetization switching trajectories of NOR operation performed by the gate composed of nanomagnets.

FIG. 5A and FIG. 5B show a modeled behavior of SOPE gates with different sizes and PMA fields for the NAND and NOR operations. Switching time is reduced from 365 ps to below 250 ps by increasing the PMA field from 800 Oe to 1200 Oe and reducing the size of the nanomagnets from 40 nm×120 nm to 24 nm×72 nm. The graphs of FIG. 5A show magnetization switching trajectories of NAND operation performed by the gate composed of nanomagnets with, from top to bottom, size (PMA field) 40 nm×120 nm, 32 nm×96 nm, and 24 nm×72 nm (800 Oe, 1000 Oe, and 1200 Oe), respectively. The graphs of FIG. 5B show magnetization switching trajectories of NOR operation performed by the gate composed of nanomagnets with, from top to bottom, size (PMA field) 40 nm×120 nm, 32 nm×96 nm, and 24 nm×72 nm (800 Oe, 1000 Oe, and 1200 Oe), respectively.

Switching dynamics corresponding to the NAND and NOR operations are illustrated in FIG. 5A and FIG. 5B for three gates composed of nanomagnets with different sizes and PMA fields. Switching trajectories, from top to bottom, correspond to the gates composed of nanomagnets with size (PMA field) 40 nm×120 nm, 32 nm×96 nm, and 24 nm×72 nm (800 Oe, 1000 Oe, and 1200 Oe), respectively. Switching time is defined as the duration over which the magnetization takes 90% of the path toward a stable state. The switching time largely reduces from 365 ps to below 250 ps, which allows operations at a clock frequency larger than 4 GHz.

The other primary basis underlying the performance of a computing system are the computing architecture and resource utilization under the power dissipation constraint. The performance of a computing system based on the concept described in this Application is described in more detail within the Discussion section hereinbelow.

Energy Dissipation

Energy dissipated by a SOPE gate depends on the materials and interfaces. For every electron charge injected into the channel, many units of angular momentum may flow into the ferromagnetic layer, leading to an energy efficient operation. Energy dissipation by existing spin-orbit heterostructures is more than the theoretical lower bound, and experimental work will achieve devices with energy dissipation closer to the theoretical limit. The spin torque ratio ($\zeta$, that is, the strength of the damping-like spin-orbit torque per unit density of the charge current in the channel, greatly affects the energy dissipation, because this quantity fundamentally determines the current density required to perform a logic operation. The resistivity of the spin-orbit channel ($\rho_s$), made of a material with strong spin-orbit interaction such as a heavy metal [4-10] or a topological insulator [11-13] (TI), is the other primary factor affecting the energy dissipation. It has been experimentally demonstrated [9-13] that inserting a buffer layer between the spin-orbit layer and the ferromagnet significantly enhances $\zeta$ and reduces $\rho_s$. The buffer layer, denoted by B in FIG. 1A, can be a thin layer of pure heavy metal, graphene, or bilayer graphene. With existing experimental parameters, the energy dissipation by a SOPE gate for performing a universal logic operation ranges from a few aJ to a few fJ (See also: Supplementary Section 4).

Discussion

State-of-the-art charge-based processing cores [25, 26] require frequent communication with a memory system to perform computing. This leads to the Von Neumann computing architecture, where a computing system is composed of separated processing and memory units. The access to the memory unit may take from a few nanoseconds to a few microseconds, thereby largely degrading the performance and increasing the power dissipation. Hence, a primary approach to enhance the performance and power dissipation of a computing system is to integrate more memory near the processor [25, 26]. However, whereas emerging data processing and learning applications need computational resources far beyond the state-of-the-art charge-based computers [27], the opportunity to integrate more on-chip memory is largely limited as the complementary-metal-oxide-semiconductor (CMOS) technology scaling approaches the fundamental limits [3]. Furthermore, in multi-gigahertz charge-based processing cores, only a fraction of on-chip resources may be efficiently utilized without permanent damage to the system by the heat generated via high power dissipation, leading to the dark silicon phenomena [28].

The SOPE gate is a conceptual step toward an ultra-energy efficient, reconfigurable computing system operating on a beyond Von Neumann architecture. Spin degree of freedom is utilized to enable electrically reconfigurable nonvolatile computing where the same devices retaining logic operands perform the logic operation and simultaneously retain the result, thus addressing both Von Neumann bottleneck and high power dissipation in state-of-the-art computing systems.

The size of a SOPE gate composed of nanomagnets with a width 24 nm, a length 72 nm, and $\Theta=60°$ can be 2.5× smaller than a transistor with minimum size implemented in 14 nm FinFET CMOS technology [29] that is state-of-the-art technology for the implementation of charge-based processors. Accordingly, the size of the SOPE gate can be more than one order of magnitude smaller than the size of a NAND or NOR gate in 14 nm FinFET CMOS Technology (See also: Supplementary Section 5). The ultra-small footprint of the gate results in large amount of on-chip computational resources which can be utilized effectively thanks to the low energy dissipation of the gate. This in turn could achieve a significant performance gain.

Conclusion

The Application has shown that spin-orbit materials provide a natural basis for spin-based execution of logic operations. Accordingly, the Application described a spin-orbit logic gate that is electrically reconfigurable and performs a universal logic operation utilizing the minimum possible number of devices. The described gate is scalable to ultralow energy dissipation levels. The described logic scheme provides a promising approach for beyond Von Neumann spin-based computing, where the elements retaining data serve to simultaneously perform logic operations and store the result. Also, the described logic gate can be beneficial in data intensive applications, such as, for example, deep learning and bioinformatics, where data exchange between the storage and processing units is the primary source of energy dissipation.

Supplementary Sections

S1. Room temperature modeling of the Spin-Orbit Perpendicular-Anisotropy (SOPE) gate The magnetic dynamics under the effect of the current induced spin-orbit torques at room temperature is governed by the Landau-Lifshitz-Gilbert-Slonczewski (LLGS) [30] equation, $$\frac{dm}{dt} = -\gamma m \times H_{eff} + \alpha m \times \frac{dm}{dt} + \gamma T_{SOT}, \quad (1)$$

where m is a unit vector along the magnetization, a is the Gilbert damping factor causing relaxation of the magnetization to its equilibrium state, and $y=g\mu_B/\hbar$ is the gyromagnetic ratio, where $\mu_B$ is the Bohr magneton and g denotes the g-factor. At any instant of time, m makes an angle of θ with ẑ, while the plane of m and ẑ makes an angle φ with x̂. The spin-orbit torque comprises a damping-like torque and a field-like torque, $$T_{SOT} = T_{DL} + T_{FL} = \frac{\hbar}{2e} \frac{J(t)}{M_s t_F}(\zeta m \times (x \times m) + \zeta_\perp m \times x), \quad (2)$$

where ζ and $\zeta_\perp$ denote the efficiency of the current in producing the damping-like and the field-like components, respectively. Because the field-like torque may be negligible in comparison with the damping-like torque [5, 12, 13], the auxiliary effect of the field-like spin-orbit torque is skipped here. $M_s$ denotes the saturation magnetization and $t_F$ denotes the thickness of the nanomagnet placed on the spin-orbit channel $H_{eff}$ represents the effective field experienced by the magnetization and is expressed as $$H_{eff} = H_k + H_{dp} + H_d + H_L. \quad (3)$$

Here $H_k$ denotes the perpendicular magnetic anisotropy field, $$H_k = 2\frac{K_u}{M_s}(m \cdot \hat{z})\hat{z}, \quad (4)$$

where $K_u$ is the magnetic anisotropy and $M_s$ is the saturation magnetization. $H_{dp}$ is the dipole field exerted by the reference layer. $H_d$ denotes the demagnetization field, $$H_d(m) = -4\pi M_s(N_i \sin(\theta)\sin(\varphi-\Theta)\hat{i}$$

$$+N_j \sin(\theta)\cos(\varphi-\Theta)\hat{j}$$

$$+N_z \cos(\theta)\hat{z}), \quad (5)$$

where $N_i$, $N_j$, and $N_z$ are demagnetizing factors and $N_i+N_j+N_z=1$. Here, î and ĵ represent the unit vectors along the length and width of the nanomagnet, respectively, $$\hat{i} = -\sin(\Theta)\hat{x} + \cos(\Theta)\hat{y} \quad (6)$$

$$\hat{j} = \cos(\Theta)\hat{x} + \sin(\Theta)\hat{y}. \quad (7)$$

Angle θ denotes the tilt angle enclosed by the length of the nanomagnet and current flow as illustrated in FIG. 1A.

A nonzero temperature introduces thermal fluctuations to the magnetization, which is modeled by the Langevin random field $H_L=(H_{L,x}, H_{L,y}, H_{L,z})$. Each component of $H_L$ follows a zero-mean Gaussian random process whose standard deviation is a function of temperature [31], $$\delta = \sqrt{\frac{2\alpha k_B T}{\gamma M_s v_F \Delta t}}. \quad (8)$$

Here $v_F$ is the volume of the nanomagnet, T denotes the temperature, and Δt is the duration of the constant effective thermal fluctuation field. As the current flows within the channel, the temperature increases through the Joule heating effect, and is proportional to the square of the current $$T(I) = T_0 + kI^2, \quad (9)$$

where I is the amplitude of the current, $T_0$ is the temperature at zero current (room temperature), and k is the Joule heating parameter which relates the temperature to the current. Joule heating decreases $M_s$ and $K_u$ as [2,24,246]

$$M_S(T) = M_{s0}(1-\beta(T-T_0)) \quad (10)$$

$$K_u(T) = K_{u0}(1-\eta(T-T_0)), \quad (11)$$

where $M_{s0}$ and $K_{u0}$ are, respectively, the saturation magnetization and magnetic anisotropy at temperature $T_0$. Coefficients β and η represent the change in, respectively, $M_s$ and $K_u$ as the temperature changes by $T-T_0$. Substituting (8) in (9), the saturation magnetization and magnetic anisotropy are proportional to the square of the current amplitude as, respectively, $$M_s(T) = M_{s0}(1-\beta kI^2) \quad (12)$$

$$K_u(T) = K_{u0}(1-\eta kI^2). \quad (13)$$

S2. Channel current control for logic operations

To perform a logic operation, a clock pulse is applied to $CLK_p$, thereby producing a current that flows into the channel underneath Q. Depending on the bit stored in P (stable magnetization state of P), the magnetic tunnel junction comprising nanomagnets $R_p$ and P ($MTJ_p$) exhibits a low or a high resistance due to the magnetoresistance effect, $$R_1^p = R_0^p(1+TMR_p), \quad (14)$$

where $TMR_p$ denotes the tunneling magnetoresistance ratio of $MTJ_p$ and $R_1^P$ ($R_0^P$) is the resistance of $MTJ_p$ when p=1 (p=0). Accordingly, the channel current density is $$J_{0(1)}^p \propto \frac{V_{CLK_P}}{R_{0(1)}^p + R_{eff} + R_c}. \quad (15)$$

Here $V_{CLK_P}$ is the clock pulse amplitude, R, is the interconnect resistance, and $R_{eff}=R_s\|R_b\|R_m$, where $R_s$, $R_b$, and $R_m$ denote the resistance of the spin-orbit layer, resistance of the buffer layer, and shunt resistance of nanomagnet Q. The interconnect is made of a low resistivity metal, such as copper, thus $R_c$ is negligible compared to $R_{0(1)}^P + R_{eff}$. Accordingly, from (14) and (15), we have $$J_0^p \propto \frac{V_{CLK_P}}{R_0^p + R_{eff}} \quad (16)$$

$$J_1^p \propto \frac{V_{CLK_P}}{R_0^p \times (1+TMR_P) + R_{eff}}. \quad (17)$$

Therefore, to switch the channel current density between $J_0^P$ and $J_1^P$, $TMR_p$ should satisfy $$TMR_P = \frac{R_0^p + R_{eff}}{R_0^p} \frac{J_0^p - J_1^p}{J_1^p}. \quad (18)$$

For the gate with the switching probability diagram illustrated in FIG. 1D, $$\frac{J_0^p}{J_1^p} = 1.75$$

ensures that $J_0^p$ lies within the $J_n$ region (J+ region) when $V_{CLKp}$ is set such that $J_1^p$ lies within the J− region ($J_n$ region). Hence, by setting $R_0^p = R_{eff}$, $TMR_p = 1.5$ (150%) is sufficient to switch the channel current density between $J_1^p \in J-$ and $J_0^p \in J_n$ or between $J_1^p \in J_n$ and $J_0^p \in J+$.

S3. Channel current control for state transferring in cascaded gates

Taking the same steps as in equations (11) to (15), and noting that $J_1^q$ is larger than $J_0^q$, the $TMR_{Q_1}$ should satisfy the following constraint so that the channel current density can be switched between $J_0^q$ and $J_1^q$.

$$TMR_{Q_1} \geq \frac{R_1 + R_{eff}}{R_1} \frac{J_1^q - J_0^q}{J_0^q}, \quad (19)$$

where $R_1$ is the resistance of MTJ $Q_1$ when $q_1=1$ and $R_{eff} = R_s \| R_b \| R_m$ is the channel resistance seen from $Q_1$. Here, $R_s$, $R_b$, and $R_m$ denote the resistance of the spin-orbit layer, resistance of the buffering layer, and shunt resistance of nanomagnet $P_2$.

S4. Energy dissipation

The average energy dissipated by performing a NOR or NAND operation using the SOPE gate is $$E = R_{eff} I_0^2 \tau_p + \left(1 + \frac{TMR_p}{2}\right) R_{eff} I_1^2 \tau_p, \quad (20)$$

where $I_0$ and $I_1$ denote the amplitude of the current produced by applying a clock pulse with a duration $T_p$ to $CLK_p$ when p is, respectively, 0 and 1. By setting $TMR_p=1.5$, from equations (13) and (14) we have $$E = \frac{11}{7} R_{eff} I_0^2 \tau_p = \frac{11}{7} R_{eff} (k+1)^2 \frac{I_{base}^2}{\zeta^2} \tau_p. \quad (21)$$

Here, $I_{base}$ is the channel current required to perform the operation when $\zeta = 1$, and $$k = \frac{\rho_s / d_s + \rho_b / d_b}{\rho_m / d_m}$$

is a constant that captures the effect of finite shunt resistance of nanomagnet Q, where $\rho_m$, $\rho_s$, and $\rho_b$ ($d_m$, $d_s$, and $d_b$) demote the resistivity (thickness) of the ferromagnetic layer, spin-orbit layer, and buffer layer, respectively.

Figure 6:
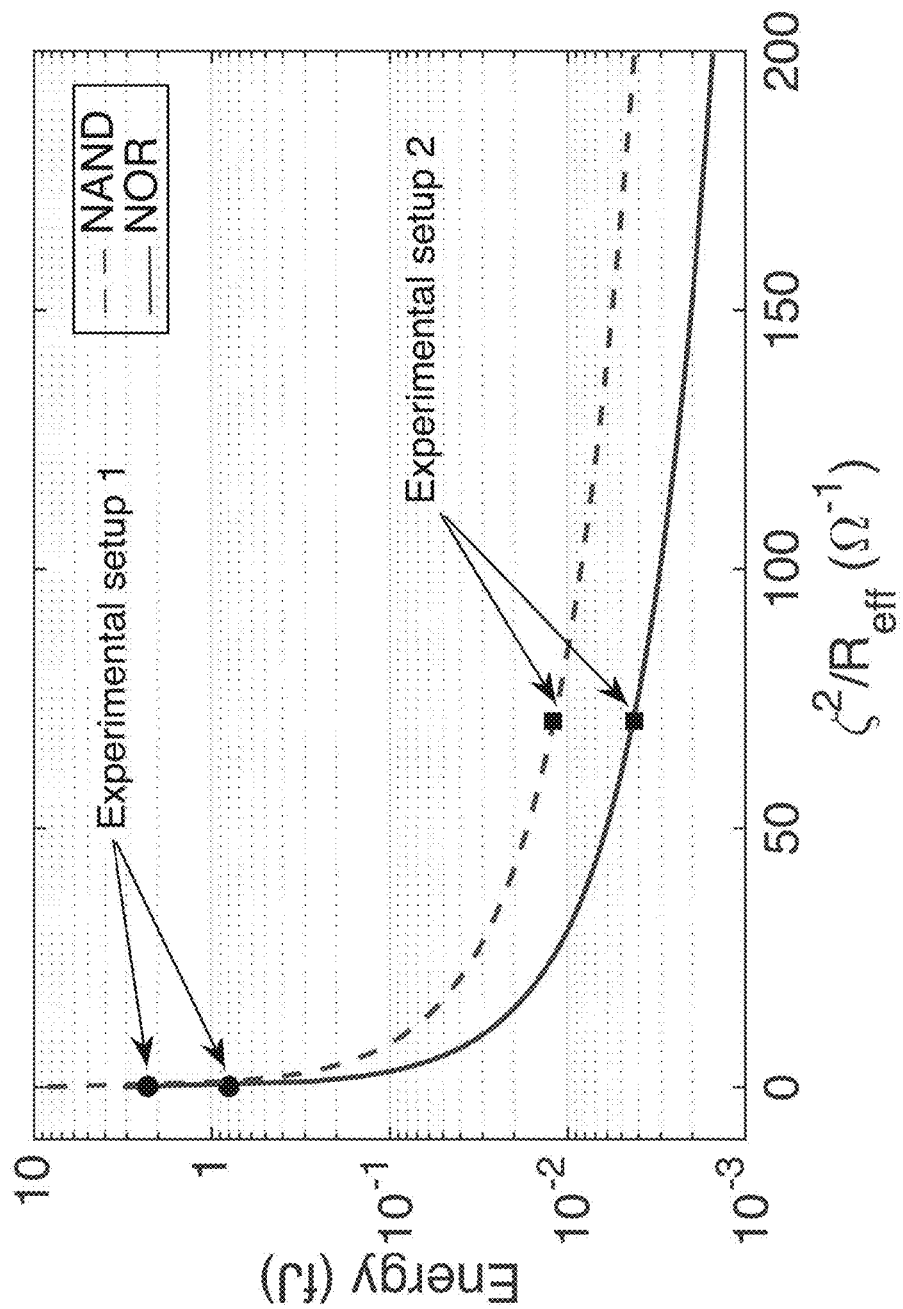
FIG. 6 shows a graph of energy dissipation for performing a NAND or NOR operation using the SOPE gate.

FIG. 6 shows a graph of energy dissipation for performing a NAND or NOR operation using the SOPE gate. The length, width, and thickness of the channel (ferromagnetic free layer) are set, respectively, to 45 nm, 65 nm, and 4 nm (72 nm, 24 nm, and 2 nm) and $\Theta=60°$. The NAND and NOR operations are performed by a clock pulse with $\tau_p=75$ ps. The marked points illustrate the energy dissipation obtained using experimentally measured parameters. For the experimental setup 1 [13], a buffer layer of Ta with a thickness of 0.5 nm is inserted between the spin-orbit channel and the ferromagnet, $\zeta$ is 18.83, and $R_{eff}$ is 1 kΩ. For the experimental setup 2 [12], the spin Hall angle $\zeta$ and $R_{eff}$ are 475 and 3 kΩ, respectively. For both experimental setups k=1, shunting half of the injected current through the ferromagnet.

As illustrated in FIG. 6, the energy dissipation per operation can range from a few aJ to a few fJ.

S5. Gate size

Figure 7:
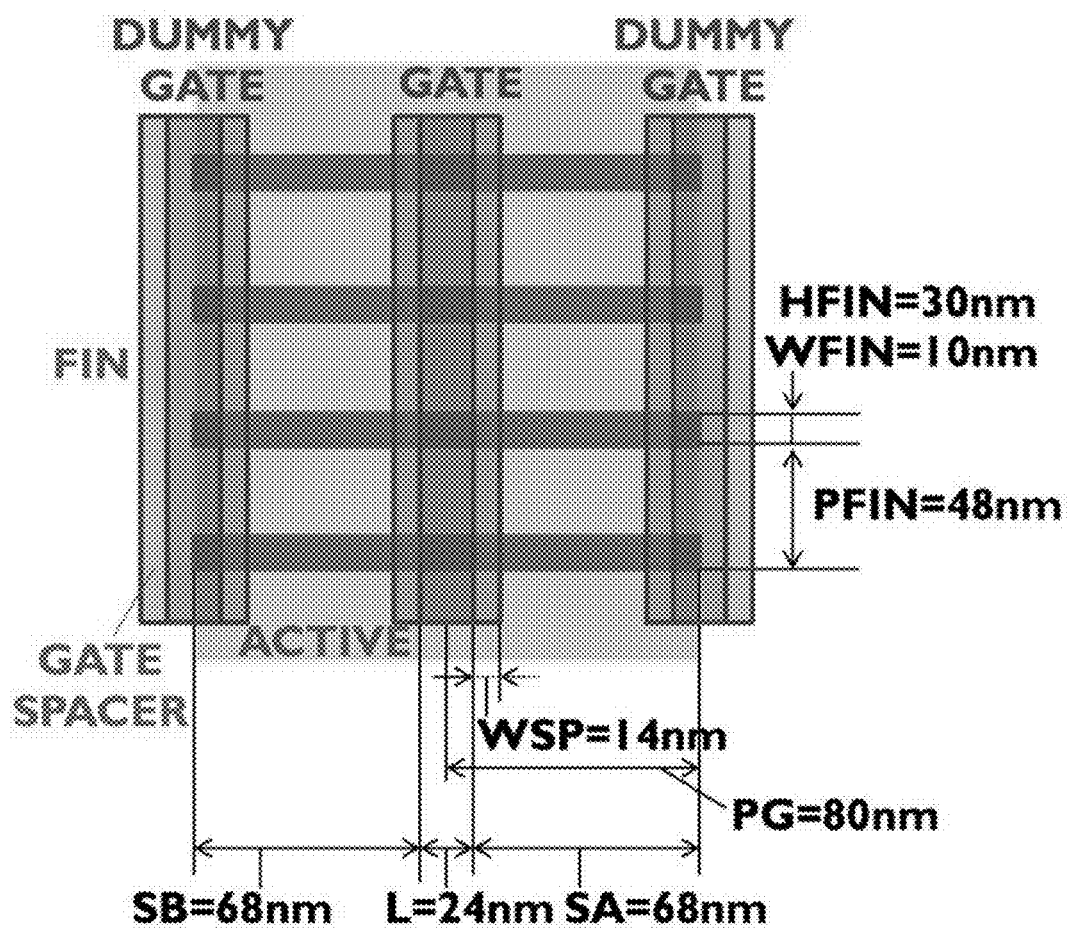
FIG. 7 shows a drawing illustrating a layout of a standard transistor with four FINs in 14 nm FinFET CMOS technology.

FIG. 7 shows a layout of a standard transistor with four FINs in 14 nm FinFET CMOS technology. Nominal dimension values are indicated in the view. FIG. 7 illustrates the layout of a standard transistor with four FINs in 14 nm FinFET CMOS technology. The size of the transistor is 212 nm×240 nm. The size of a minimum-size transistor (a transistor with one FIN) in 14 nm FinFET CMOS technology is 212 nm×86 nm.

Figure 8:
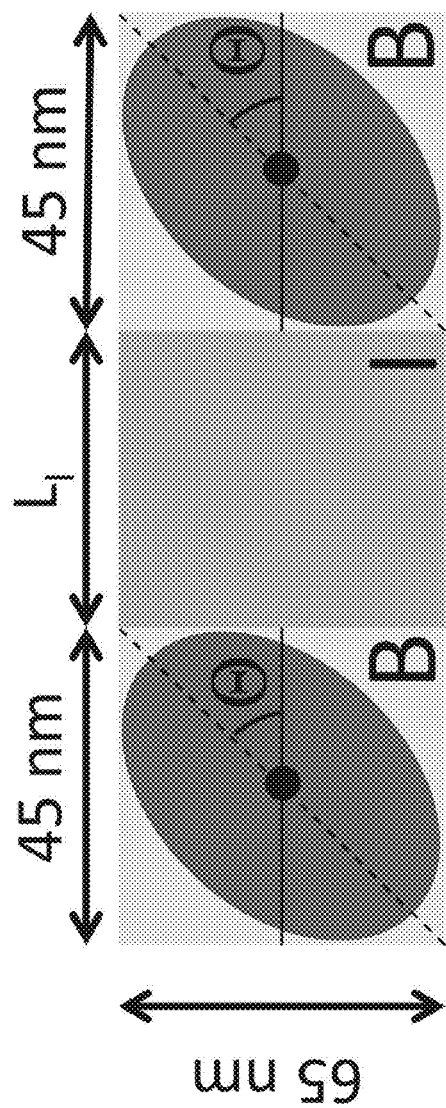
FIG. 8 shows a drawing illustrating a Top view of an exemplary SOPE gate.

FIG. 8 shows a Top view of an exemplary SOPE gate. The length and width of the nanomagnets are set to, respectively, 72 nm and 24 nm, and $\Theta=60°$. By setting $L_1=25$ nm, the area of the SOPE gate is 2.5× smaller the minimum-size transistor in 14 nm FinFET CMOS technology. Accordingly, the area of a SOPE gate composed of nanomagnets with a width 24 nm, a length 72 nm, and $\Theta=60°$, as illustrated in FIG. 8, can be 2.5× smaller than the minimum-size transistor. A standard charge-based NAND or NOR gate in CMOS technology is composed of four transistors. Hence, even by ignoring the size overhead imposed by the minimum metal pitch and spacing within a charge-based NAND or NOR gate, the area of a SOPE gate can be more than 10× smaller than a charge-based NAND or NOR gate implemented in 14 nm FinFET CMOS technology.

Modeling software as described herein can be provided on a computer readable non-transitory storage medium. A computer readable non-transitory storage medium as non-transitory data storage includes any data stored on any suitable media in a non-fleeting manner Such data storage includes any suitable computer readable non-transitory storage medium, including, but not limited to hard drives, non-volatile RAM, SSD devices, CDs, DVDs, etc.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

REFERENCES

1. Wolf, S. A. et al. Spintronics: a spin-based electronics vision for the future. *Science* 294, 1488-1495 (2001).
2. Nikonov, D. E., Bourianoff, G. I. & Gargini, P. A., Power dissipation in spintronic devices out of thermodynamic equilibrium. *Journal of Superconductivity and Novel Magnetism* 19, 497-513 (2006).
3. Markov, I. Limits on fundamental limits to computation. *Nature* 512, 147-154 (2014).
4. Miron, I. M. et al. Perpendicular switching of a single ferromagnetic layer induced by in-plane current injection. *Nature* 476, 189-193 (2011).
5. Liu, L. Q., Lee, O. J., Gudmundsen, T. J., Ralph, D. C. & Buhrman, R. A. Current-induced switching of perpendicularly magnetized magnetic layers using spin torque from the spin Hall effect. *Physical Review Letters* 109, 096602 (2012).

6. Liu, L. Q. et al. Spin-torque switching with the giant spin Hall effect of tantalum. *Science* 336, 555-558 (2012).
7. Garello, K. et al. Symmetry and magnitude of spin-orbit torques in ferromagnetic heterostructures. *Nature Nanotechnology* 8, 587-593 (2013).
8. Kim, J et al. Layer thickness dependence of the current-induced effective field vector in Ta|CoFeB|MgO. *Nature Materials* 12, 240-245 (2013).
9. Pai, C.-F. et al Enhancement of perpendicular magnetic anisotropy and transmission of spin-Hall-effect-induced spin currents by a Hf spacer layer in W/Hf/CoFeB/MgO layer structures. *Applied Physics Letters* 104, 082407 (2014)
10. Zhang, W. et al. Role of transparency of platinum-ferromagnet interfaces in determining the intrinsic magnitude of the spin Hall effect. *Nature Physics* 11, 496-502 (2015).
11. Mellnik, A. R. et al. Spin-transfer torque generated by a topological insulator. *Nature* 511, 449-451 (2014).
12. Fan, Y. et al. Magnetization switching through giant spin-orbit torque in a magnetically doped topological insulator heterostructure. *Nature Materials* 511, 699-704 (2014).
13. Mahendra, D. C. et al. Room-temperature perpendicular magnetization switching through giant spin-orbit torque from sputtered BixSe(1-x) topological insulator material. *arXiv preprint arXiv:* 1703.03822 (2017).
14. Kazemi, M. et al. All-spin-orbit switching of perpendicular magnetization. *IEEE Transactions on Electron Devices* 11, 4499-4505 (2016).
15. Ney, A. et al. Programmable computing with a single magnetoresistive element. *Nature* 425, 485-487 (2003).
16. Dery, H. et al. Spin-based logic in semiconductors for reconfigurable large-scale circuits. *Nature* 447, 573-576 (2007).
17. Xu, P. et al. An all-metallic logic gate based on current-driven domain wall motion. *Nature Nanotechnology* 3, 97-100, (2008).
18. Behin-Aein, B. et al. Proposal for an all-spin logic device with built-in memory. *Nature Nanotechnology* 5, 266-270 (2010).
19. Su, L. et al. Current limiting challenges for all-spin logic devices. *Scientific Reports* 5, 1-11 (2015).
20. Mankalaleh, M. G. et al. CoMET: Composite-input magnetoelectric based logic technology. *IEEE Journal on Exploratory Solid-State Computational Devices and Circuits* 3, 27-36 (2017).
21. Manipatruni, S. et al. Spin-orbit logic with magneto-electric switching: a multi-generation scalable charge mediated nonvolatile spintronic logic. *arXiv preprint arXiv:* 1512.05428 3, 27-36 (2017).
22. Kazemi, M. et al. Compact model for spin-orbit magnetic tunnel junctions. *IEEE Transactions on Electron Devices* 2, 848-855 (2016).
23. Kazemi, M., Ipek, E. & Friedman, E. G. Adaptive compact magnetic tunnel junction model. *IEEE Transactions on Electron Devices* 11, 3883-3891 (2014).
24. Ikeda, S. et al. Tunnel magnetoresistance of 604% at 300 K by suppression of Ta diffusion in CoFeB/MgO/CoFeB pseudo-spin-valves annealed at high temperature. *Applied Physics Letters* 93, pp. 0825081-0825083 (2008).
25. Fluhr, E. J. et al. POWERS: A 12-core server-class processor in 22 nm SOI with 7.6 Tb/s off-chip bandwidth. *International Solid-State Circuits Conference*, pp. 96-98 (2014).
26. Bowhill, B. et al. The Xeon processor ES-2600 v3: A 22 nm 18-core product family. *IEEE Journal of Solid State Circuits* 51, pp. 92-104 (2016).
27. Kazemi, M. & Bocko, M. F. gMRAM: Gain-cell magnetoresistive random access memory for high density embedded storage and in-situ computing. *IEEE International Midwest Symposium on Circuits and Systems,* 405-408 (2017).
28. Esmaeilzadeh, H. et al. Dark silicon and the end of multicore scaling. *IEEE Micro* 32, pp. 122-134 (2012).
29. Eyal, F. et al. 14 nm 6th-Generation Core Processor SoC with Low Power Consumption and Improved Performance *IEEE International Solid-State Circuits Conference*, pp. 72-73 (2016).
30. Slonczewski, J. C. Current-driven excitation of magnetic multilayers. *Journal of Magnetism and Magnetic Materials* 159, L1-L7 (1996).
31. Brown, W. F. Jr. Thermal fluctuations of a single-domain particle. *Journal of Applied Physics* 130, 1677-1686 (1963).

What is claimed is:

1. An integrated logic device comprising:
a channel comprising an interconnect section and a pair of spin orbit segments, each spin orbit segment connected to said interconnect section at either end of said interconnect section;
a P structure comprising a P magnet disposed on a surface of a spin orbit segment, a tunneling barrier disposed between said P magnet and a Rp magnetic reference layer;
a Q structure comprising a Q magnet disposed on a surface of another spin orbit segment, a tunneling barrier disposed between said Q magnet and a Rq magnetic reference layer; and
a CLKp terminal electrically coupled to said Rp magnetic reference layer, a CLKq terminal electrically coupled to said Rq magnetic reference layer, and at least one ground terminal electrically coupled to a surface of either of said interconnect section or said pair of spin orbit segments.

2. The integrated logic device of claim 1, wherein at least one of said P magnet or said Q magnet comprises a perpendicular-anisotropy nanomagnet.

3. The integrated logic device of claim 1, wherein at least one of said P magnet or said Q magnet comprises an elliptical shape.

4. The integrated logic device of claim 3, wherein a long axis of an elliptical magnet encloses an angle of between about 5 and 175 degrees with current flow in said interconnect section.

5. The integrated logic device of claim 1, wherein said integrated logic device further comprises an optional buffer layer disposed between said P magnet and said Q magnet and said surface of a spin orbit segment.

6. The integrated logic device of claim 1, further comprising a cascaded integrated logic device coupled to a side of a spin orbit segment of said pair of spin orbit segments.

7. The integrated logic device of claim 1, wherein said interconnect section comprises a metal.

8. The integrated logic device of claim 7, wherein said interconnect section comprises a copper.

9. The integrated logic device of claim 1, wherein at least one of said spin orbit segments comprises a heavy metal.

10. The integrated logic device of claim 9, wherein said heavy metal comprises a platinum.

11. The integrated logic device of claim 1, wherein said integrated logic device is a spin-orbit perpendicular-anisotropy (SOPE) gate.

12. The integrated logic device of claim 1, wherein said integrated logic device substantially simultaneously performs a logic operation and stores a non-volatile result of said logic operation.

* * * * *